(12) United States Patent
Ren

(10) Patent No.: US 10,866,087 B2
(45) Date of Patent: Dec. 15, 2020

(54) DISPLAY DEVICE, METHOD FOR FABRICATING THE SAME, AND METHOD FOR COLLECTING INFORMATION BY USING THE SAME

(71) Applicants: Beijing BOE Display Technology Co., Ltd., Beijing (CN); BOE TECHNOLOGY GROUP CO., LTD., Beijing (CN)

(72) Inventor: Jinyu Ren, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/524,334

(22) Filed: Jul. 29, 2019

(65) Prior Publication Data
US 2020/0217649 A1 Jul. 9, 2020

(30) Foreign Application Priority Data
Jan. 4, 2019 (CN) .......................... 2019 1 0009463

(51) Int. Cl.
*G01B 11/25* (2006.01)
*H01L 27/32* (2006.01)

(52) U.S. Cl.
CPC .......... *G01B 11/25* (2013.01); *H01L 27/3225* (2013.01)

(58) Field of Classification Search
None
See application file for complete search history.

(56) References Cited

U.S. PATENT DOCUMENTS

| 8,605,059 B2 * | 12/2013 | Kurokawa | G06F 3/042 345/175 |
| 2012/0242636 A1 * | 9/2012 | Yuki | G06F 3/0412 345/207 |

(Continued)

FOREIGN PATENT DOCUMENTS

| CN | 101887691 | 11/2010 |
| CN | 102096526 | 6/2011 |

(Continued)

OTHER PUBLICATIONS

1st Office Action dated May 20, 2020 for Chinese Patent Application No. 201910009463.7.

*Primary Examiner* — Fernando Alcon
(74) *Attorney, Agent, or Firm* — Thomas | Horstemeyer LLP

(57) ABSTRACT

The present disclosure provides a display device, a method for fabricating the same, and a method for collecting information using the same. The display device includes a display panel having a plurality of sub-pixels, at least a portion of the sub-pixels being information collection sub-pixels provided with light conversion material, and the light conversion material being capable of absorbing light emitted by the information collection sub-pixel and emitting infrared light to an external object; an information receiving device disposed on at least one side of a display area of the display panel, the information receiving device being configured to receive an infrared light signal reflected by the external object and to acquire depth information of the external object according to the infrared light signal.

15 Claims, 3 Drawing Sheets

(56) References Cited

U.S. PATENT DOCUMENTS

| | | | |
|---|---|---|---|
| 2015/0341573 A1* | 11/2015 | Matsuo | H04N 5/332 |
| | | | 348/135 |
| 2016/0365394 A1 | 12/2016 | Suh et al. | |
| 2017/0064219 A1* | 3/2017 | Lin | H04N 5/33 |
| 2019/0325186 A1* | 10/2019 | Gao | G06K 9/22 |
| 2020/0036913 A1* | 1/2020 | Asano | G02B 3/0037 |
| 2020/0064686 A1* | 2/2020 | Jiang | G02F 1/133528 |

FOREIGN PATENT DOCUMENTS

| | | | | |
|---|---|---|---|---|
| CN | 107302010 | | 10/2017 | |
| CN | 108710449 | | 10/2018 | |
| CN | 201810966792 | * | 12/2018 | G02F 1/1335 |

* cited by examiner

DISPLAY DEVICE, METHOD FOR FABRICATING THE SAME, AND METHOD FOR COLLECTING INFORMATION BY USING THE SAME

CROSS-REFERENCE TO RELATED APPLICATIONS

The present application is based on, and claims the benefit of and priority to, Chinese Patent Application No. 201910009463.7, filed on Jan. 4, 2019, the entire contents of which being incorporated herein by reference.

TECHNICAL FIELD

The present disclosure relates to the field of spatial positioning technology and, in particular, to a display device, a method for fabricating the same, and a method for collecting information by using the same.

BACKGROUND

With the rapid development of 3D and virtual display (VR) technologies, 3D spatial positioning technology has become more and more widely used in the display industry. However, existing spatial positioning technologies present various problems, such as large hardware requirements, complicated algorithms, complex structures, high requirements for hardware, such as processors, low product yield, and low product performance. It is a hot research topic about how to overcome these problems in order to realize the miniaturization of spatial positioning technology and integration with display panels. However, current spatial positioning technology still needs to be improved.

SUMMARY

The present disclosure aims to at least solve at least one of the technical problems in the related art to some extent. To this end, an objective of the present disclosure is to provide a display device that is simple in structure, easy to implement, and can realize spatial positioning or can acquire depth information of an external object.

In an aspect of the present disclosure, a display device is provided. According to an embodiment of the present disclosure, the display device may include: a display panel having a plurality of sub-pixels, part of the sub-pixels being information collection sub-pixels each provided with a light conversion material, and the light conversion material being capable of absorbing light emitted by the information collection sub-pixel and emitting infrared light to an external object; an information receiving device disposed on at least one side of a display area of the display panel, the information receiving device being configured to receive an infrared light signal reflected by the external object and to acquire depth information of the external object according to the infrared light signal.

According to an embodiment of the present disclosure, the information collection sub-pixels are distributed on the display panel according to a predetermined pattern, the predetermined pattern including at least one of a dot matrix, a circle, a circular ring, a regular polygon, and an irregular polygon.

According to an embodiment of the present disclosure, at least one of the information collection sub-pixels is a blue sub-pixel, and the light conversion material is selected from materials that may absorb blue light and emit infrared light.

According to an embodiment of the present disclosure, the light conversion material is selected from $Y_{1.98-x}Yb_xEu_{0.02}O_3$ series phosphor, where x ranges from 0 to 0.1.

According to an embodiment of the present disclosure, the light conversion material is disposed on at least a portion of a surface at a light emitting side of a light emitting element of the information collection sub-pixel.

According to an embodiment of the present disclosure, a lens is provided on a light emitting side of the light conversion material for concentrating the infrared light emitted by the light conversion material.

According to an embodiment of the present disclosure, the lens is disposed on a surface at the light emitting side of the light conversion material, or disposed on a surface at a light emitting side of a substrate/package thin film of the display panel.

According to an embodiment of the present disclosure, the information receiving device is disposed in a non-display area of the display panel.

According to an embodiment of the present disclosure, a line between and connecting the information receiving device and the information collection sub-pixel, a line between and connecting a light spot generated when the infrared light emitted by the information collection sub-pixel is irradiated on the external object and the information collection sub-pixel, and a line connecting the light spot and the information receiving device substantially form a right triangle.

In another aspect of the present disclosure, the present disclosure provides a method for fabricating a display device as described above. According to an embodiment of the present disclosure, the method includes: forming a display panel having a plurality of sub-pixels, and providing a light conversion material on a surface at a light emitting side of a light emitting layer of each of part of the sub-pixels, to form an information collection sub-pixel; and providing an information receiving device on at least one side of the display panel.

According to an embodiment of the present disclosure, the method further includes: providing a lens on a light emitting side of the light conversion material.

In another aspect of the present disclosure, the present disclosure provides a method for collecting information by using a display device as described above. According to an embodiment of the present disclosure, the method includes: controlling a bright and dark state of each of information collection sub-pixels, respectively, according to a set of codes, a plurality of codes in the set of codes being in one-to-one correspondence with the bright and dark states of the information collection sub-pixels, and there being a difference between any two of the codes; receiving a set of infrared light signals having corresponding codes by an information receiver, and calculating by a structured light triangulation method based on the infrared light signals to acquire depth information of the external object.

According to an embodiment of the present disclosure, each of the codes includes at least two bits, each bit of the codes corresponds to the bright and dark state of the information collection sub-pixel at a moment, the same bits in the plurality of codes correspond to the bright and dark states of the plurality of information collection sub-pixels at the same moment, and the bright and dark state of the sub-pixel at a corresponding moment is controlled according to different values of each bit in the code.

According to an embodiment of the present disclosure, each of the codes includes n bits, where n is an integer greater than or equal to 2, and a first bit, a second bit, . . . , a nth bit in each of the codes correspond to the corresponding bright and dark states of the information collection sub-pixel at continuous first, second, . . . , nth moments, respectively.

According to an embodiment of the present disclosure, the set of codes is a set of Gray codes, the corresponding bit in the corresponding code is valued as one of 0 and 1 when the information collection sub-pixel is in a bright state, and the corresponding bit in the corresponding code is valued as the other one of 0 and 1 when the information collection sub-pixel is in a dark state.

According to an embodiment of the present disclosure, the method for collecting information includes: acquiring depth information of a reference plane according to the step of acquiring depth information of an external object as defined before, before acquiring the depth information of the external object; and determining the depth information of the external object with respect to the reference plane according to the depth information of the external object and the depth information of the reference plane.

DETAILED DESCRIPTION

Figure 1:
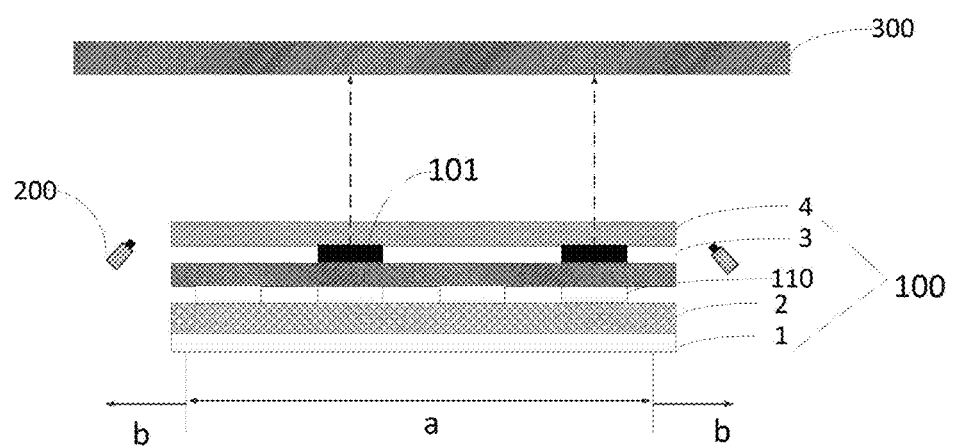
FIG. 1 is a schematic structural view of acquiring depth information of an object by using a display device according to an embodiment of the present disclosure.

Embodiments of the present disclosure are described in detail below. The embodiments described below are illustrative and only intended to interpret the present disclosure, and are not intended to be construed as a limitation of the present disclosure. If none of specific techniques or conditions are indicated in the examples, these examples can be carried out according to techniques or conditions described in the references in the art or in accordance with the product specifications. If reagents or instruments used are not indicated by the manufacturer, they will be conventional products that can be obtained commercially.

The present disclosure is realized based on the following understandings and findings:

Most of the existing solutions for realizing spatial positioning are to realize the depth information identification of an external object by adding a projection light source and an information receiving device. The structure for spatial positioning is complicated, further increasing the difficulty of the OLED process and thus, affecting the product yield and the product performance. In the present application, a light conversion material that may absorb light emitted by the sub-pixel and emit infrared light is added into part of the sub-pixels in the display panel, so that the above sub-pixel becomes an infrared light source of depth information recognition system. The infrared light emitted from the sub-pixel is reflected by the external object and is then received by the information receiving device in the display device, and the display device may acquire the depth information of the external object according to the reflected infrared light signal, and may simultaneously realize the display function and the spatial positioning function.

In view of this, in an aspect of the present disclosure, the present disclosure provides a display device. According to an embodiment of the present disclosure, referring to FIG. 1, the display device includes: a display panel 100 having a plurality of sub-pixels, part of the sub-pixels being information collection sub-pixels each provided with a light conversion material 101, and the light conversion material 101 being capable of absorbing light emitted by the information collection sub-pixel and emitting infrared light to an external object; an information receiving device 200 disposed on at least one side of the display area of the display panel 100, the information receiving device 200 being configured to receive an infrared light signal reflected by the external object 300, and to acquire depth information of the external object 300 according to the infrared light signal. It has been found that the information collection sub-pixel of the display device is used as a projection light source without additionally adding a projection light source, so that the display device is simple in structure and easy to implement, has low cost and small volume, can simultaneously achieve the display function and the information acquisition or spatial positioning function, and has high precision for acquiring depth information of an external object. Also, the display device has high display yield and excellent product performance. It should be noted that, referring to FIG. 1, the information receiving device 200 being disposed at least one side of the display area of the display panel 100 means that, the display panel 100 has a display area "a" and a non-display area "b" disposed around the display area "a", and the information receiving device 200 is outside the display area "a", i.e., the display area "a" faces towards at least one of four outer sides of the non-display area "b".

In some embodiments of the present disclosure, the information receiving device is disposed in the non-display area "b" of the display panel. Thus, the information receiving device can be integrated in the display panel, which is advantageous for reducing the hardware volume of the display device, simplifying the structure of the display device, and further facilitating miniaturization of the spatial positioning technology and integration with the display panel.

In some embodiments of the present disclosure, a line between and connecting the information receiving device and the information collection sub-pixel, a line between and connecting a light spot generated when the infrared light emitted by the information collection sub-pixel is irradiated on the external object and the information collection sub-pixel, and a line connecting the light spot and the information receiving device substantially form a right triangle. Thus, the algorithm program of the spatial positioning technology is simplified, and the production cost and development difficulty of the display device can be reduced.

According to an embodiment of the present disclosure, the structure of the sub-pixel may refer to the structure of a conventional sub-pixel. Specifically, referring to FIG. 1, the sub-pixel includes a thin film transistor distributed in an array circuit 2 on a first surface of the base 1, where the array circuit 2 includes: an anode (not shown) for exciting the light emitting layer to emit light; a light emitting layer 110 being disposed on a surface of the array circuit 2 away from the base 1; a cathode 3 being disposed on a surface of the light emitting layer 110 away from the base 1, where the material for forming the anode and the cathode may include, but is not limited to, a metal (e.g., gold, silver, etc.), indium tin oxide, or the like. According to an embodiment of the present disclosure, the structure of the display panel can also refer to the structure of a conventional display panel. Specifically, referring to FIG. 1, the display panel may further include a substrate/package thin film 4 disposed on a side of the light conversion material away from the base 1, in addition to the foregoing structures; where the material for forming the base and the substrate may include, but not limited to, glass, resin, or the like, and the package thin film may include a plurality of organic film layers and inorganic film layers which are alternately disposed. Thus, the structure is simple and easy to implement. It should be noted that, FIG. 1 is only intended to illustrate the structure and process related to information collection and thus, does not show all the structures of the display device. Those skilled in the art can understand that the remaining structures which are not shown may be conventional structures of the display device, and will not be described herein.

According to an embodiment of the present disclosure, the information collection sub-pixels are distributed on the display panel according to a predetermined pattern, and the predetermined pattern includes at least one of a dot matrix, a circle, a circular ring, a regular polygon, and an irregular polygon. Thus, different arrangements can be flexibly selected according to different usage conditions, and the application scope is wide.

According to an embodiment of the present disclosure, the predetermined pattern being a dot matrix refers to: the information collection sub-pixels constitute a plurality of sub-patterns, the plurality of sub-patterns are distributed in rows and columns on the display panel, the information collection sub-pixels are evenly distributed, and the accuracy of information collection or spatial positioning is higher. In some embodiments, each sub-pattern may be composed of one information collection sub-pixel. For example, if the number of information collection sub-pixels is nine, these nine information collection sub-pixels may be arranged in a 3×3 format. The spacing between any two information collection sub-pixels in each row and each column of information collection sub-pixels may be determined according to the number of pixel units in the display panel. For example, if the display panel includes 2000 pixel units in one row, an information collection sub-pixel may be provided at every 500 pixel units, so that the information collection sub-pixels may be distributed as evenly as possible within the display area of the display device. In other embodiments, each sub-pattern may be composed of a plurality of information collection sub-pixels, i.e., the plurality of adjacent information collection sub-pixels constitute one sub-pattern, where the specific shape of each sub-pattern may be a circle, a triangle, a quadrangle, or other regular and irregular polygon, and the dimension of each sub-pattern and the spacing between the two adjacent sub-patterns are required to be determined according to the number of pixel units in the display panel. For example, if the sub-patterns are distributed in two rows and two columns and the display panel includes 2000 pixel units in one row, a sub-pattern may have a width of 400 pixel units in the row direction, and a distance between two adjacent sub-patterns in the row direction may also be 400 pixel units. According to an embodiment of the present disclosure, the predetermined pattern being a circle, a circular ring, a regular polygon, or an irregular polygon means that all of the information collection sub-pixels constitute the above-mentioned shape. Those skilled in the art can understand that the above description is only intended to schematically describe the solution of the present application, and is not to be construed as a limitation of the present application. In actual use, the number of information collection sub-pixels can be flexibly selected according to actual requirements. Those skilled in the art can also understand that the greater the distribution density of the information collection sub-pixels, the higher the number of the information collection sub-pixels, and the higher the detection accuracy and precision. According to an embodiment of the present disclosure, in order to effectively achieve spatial positioning, the information collection sub-pixel is a blue sub-pixel, and the light conversion material is a material that may absorb blue light and emit infrared light. Thus, when the blue sub-pixel is lit, the light conversion material may absorb blue light (with a wavelength of 400 nm to 475 nm) and emit infrared light, and becomes an infrared point light source for depth information recognition.

Figure 2:
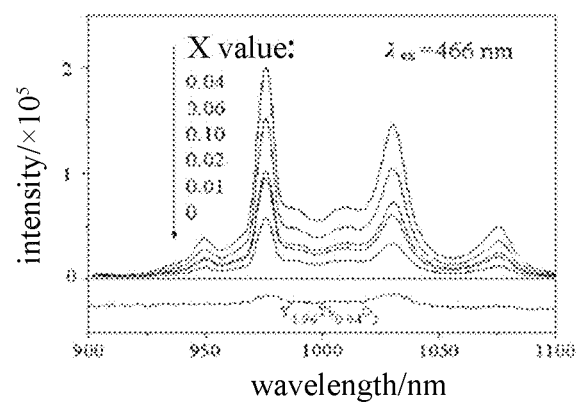
FIG. 2 is a spectrum of correspondingly absorbing infrared light and emitting near-infrared light of the $Y_{1.98-x}Yb_xEu_{0.02}O_3$ series phosphor when x is taken as different values.

According to an embodiment of the present disclosure, the light conversion material is selected from $Y_{1.98-x}Yb_xEu_{0.02}O_3$ series phosphor. Thus, the light conversion material absorbs blue light and emits infrared light with high efficiency, and can be used as an infrared point light source for depth information identification, which is favorable for subsequent spatial positioning. In some embodiments of the present disclosure, referring to FIG. 2, the $Y_{1.98-x}Yb_xEu_{0.02}O_3$ series phosphor may absorb blue light having a wavelength ($\lambda_{ex}$) of 466 nm, and emit near-infrared light having a wavelength of 976 nm, 1030 nm, and 1075 nm. Thus, the light conversion material is excellent in the effects of absorbing blue light and emitting infrared light.

According to an embodiment of the present disclosure, for the $Y_{1.98-x}Yb_xEu_{0.02}O_3$ series phosphor, the value x ranges from 0 to 0.1 (for example, 0, 0.01, 0.02, 0.04, 0.06, 0.1, etc.). In some embodiments of the present disclosure, referring to FIG. 2, when x is less than 0.04, the intensity of $Y_{1.98-x}Yb_xEu_{0.02}O_3$ absorbing blue light and emitting infrared light gradually increases as the value range of x increases; when x is greater than 0.04, the intensity of $Y_{1.98-x}Yb_xEu_{0.02}O_3$ absorbing blue light and emitting infrared light gradually decreases; and when x is equal to 0.04, the intensity of $Y_{1.98-x}Yb_xEu_{0.02}O_3$ absorbing blue light and emitting infrared light is strongest. Based on this, in some preferred embodiments of the present disclosure, the value of x is 0.04 and thus, the intensity of the light conversion material absorbing blue light and emitting infrared light is stronger, which is advantageous for improving the accuracy of the spatial positioning technology so that the depth information of the acquired external object is accurate.

According to an embodiment of the present disclosure, referring to FIG. 1, the light conversion material 101 is disposed on at least a portion of a surface of a light emitting element (including a cathode, a light emitting layer, and an anode) of the information collection sub-pixel at the light emitting side. Thus, as the light conversion material is disposed on the surface of the light emitting element at the light emitting side thereof, the light conversion material may absorb light of the information collection sub-pixel and emit infrared light more efficiently, and the structure of the display device can be simplified. The information collection sub-pixel is used as the light source of the infrared light without adding a projection light source, which is advantageous for realizing miniaturization of the spatial positioning technology, realizing integration with the display panel, and realizing spatial positioning without changing the existing OLED design and thus, reducing cost. According to an embodiment of the present disclosure, a ratio of an area of the orthographic projection of the light conversion material on the light emitting layer of the light emitting element and an area of the light emitting layer is greater than 0 and less than or equal to 1. Thus, the structure is simple and easy to implement, and the light conversion material may absorb light emitted from the light emitting layer and emit infrared light with high efficiency. According to an embodiment of the present disclosure, the intensity of the infrared light emitted by the light conversion material is greater than or equal to 0, and less than or equal to the brightness of the information acquisition sub-pixel multiplied by the light conversion efficiency of the light conversion material. Thus, the intensity of the infrared light emitted by the light conversion material can be flexibly adjusted according to actual requirements, so as to better meet usage requirements.

It should be noted that the description of "light emitting side thereof" or "light emitting side of . . . " used in the present disclosure refers to the side towards the light emitting direction of the display panel. For example, referring to FIG. 1, the light conversion material is disposed on the surface of the light emitting element at the light emitting side thereof, that is, the light conversion material is disposed on the surface of the light emitting element towards the light emitting direction of the display panel (i.e., the surface of the cathode away from the light emitting layer).

According to an embodiment of the present disclosure, the principle of the above-mentioned display device acquiring depth information of an external object is as follows.

Figure 3:
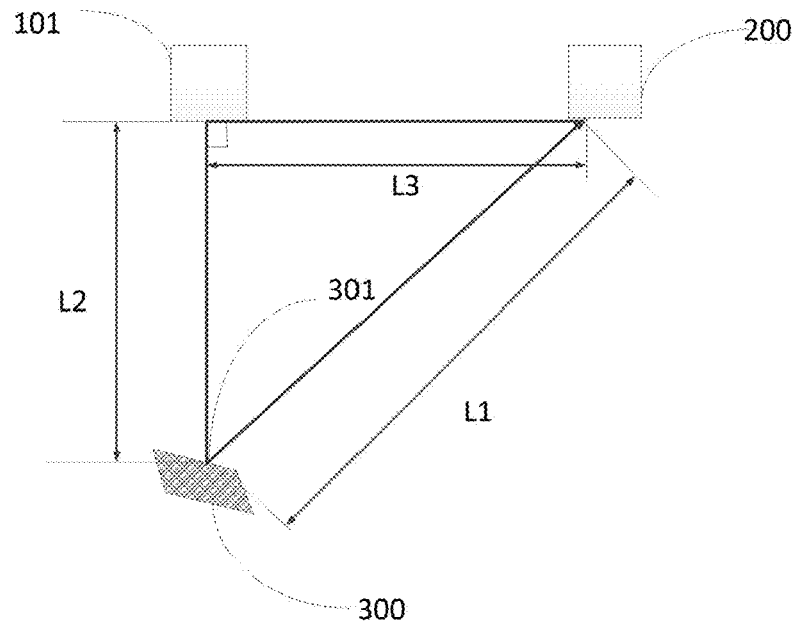
FIG. 3 is a schematic view of acquiring depth information of an object by using a structured light triangulation method according to an embodiment of the present disclosure.
Figure 6:
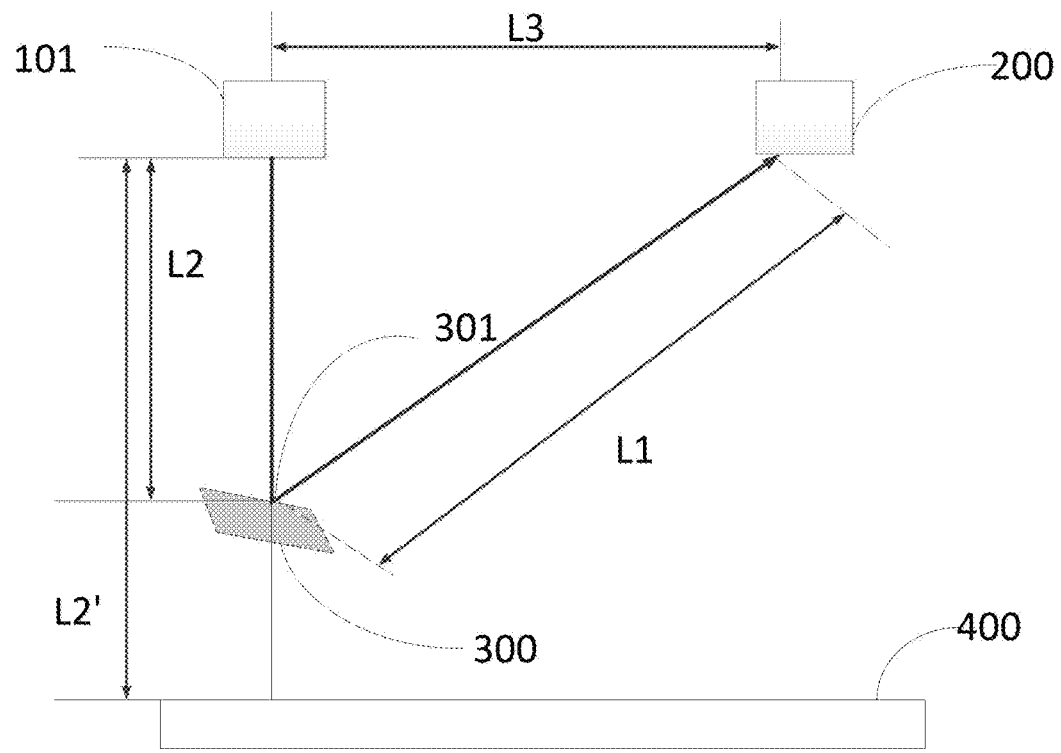
FIG. 6 is a schematic view of acquiring depth information of an object by using a structured light triangulation method according to another embodiment of the present disclosure.

Now, an information collection sub-pixel is taken as an example for description purposes. Specifically, referring to FIGS. 1 and 3, when the information collection sub-pixel is lit, the light emitting layer 110 in the information collection sub-pixel emits light, and the light conversion material 101 will absorb the emitted light and emits infrared light which is reflected by the external object 300 after being irradiated onto the external object 300. The information receiving device 200 receives the reflected infrared light signal and then transmits it to the processing device (not shown). Then, the depth information of the object 300 is calculated according to the structured light triangulation method. The information receiving device 200, the light conversion material 101 and the point 301 formed by the infrared light being irradiated on the external object 300 substantially form a right triangle. The light conversion material 101 is at a right angle point, i.e., a line connecting the information receiving device 200 and the point 301 formed by the infrared light being irradiated on the external object is a hypotenuse, a line connecting the light conversion material 101 and the point 301 formed by the infrared light being irradiated on the external object 300 is a first right-angled edge, and a line connecting the light conversion material 101 and the information receiving device 200 is a second right-angled edge. The principle of the structured light triangulation method may be as follows: a time interval "t" from the emission of the infrared light by the light conversion material 101 to the receipt of the infrared light signal by the information receiving device 200 may be detected by the information receiving device 200, the propagation speed of the infrared light is known, i.e., a sum of the length L1 of the hypotenuse and the length L2 of the first right-angled edge can be calculated by the time interval "t", and a distance between the information collection sub-pixel and the information receiving device is constant, i.e., the length L3 of the second right-angled edge is known, so that the depth information of the object (i.e., the length L2 of the first right-angled edge) can be calculated by the Pythagorean theorem. According to an embodiment of the present disclosure, the depth information of two or more points on the external object may also be determined using the above principle, and then the relative depth information between the two or more points (such as a distance between two points) is acquired according to the depth information of each point. According to an embodiment of the present disclosure, referring to FIG. 6, before testing the depth information of the external object, the distance L2' between the light conversion material 101 and the reference plane 400 may be tested by the above method and then, the distance L2 between the light conversion material 101 and the external object 300 may be tested by the above method, so that the relative depth between the external object 300 and the reference plane 400 may be acquired.

According to an embodiment of the present disclosure, in order to improve the accuracy of spatial positioning, the light conversion material is provided with a lens at its light emitting side for concentrating the infrared light emitted by the light conversion material. Thus, the light emitted by the information collection sub-pixel may be emitted to the external object in the form of a light beam, such that the energy is more concentrated, energy loss is less during the propagation process, the detection precision and accuracy are higher, the spatial positioning is more accurate, and the acquired depth information of the external object is more precise.

Figure 7:
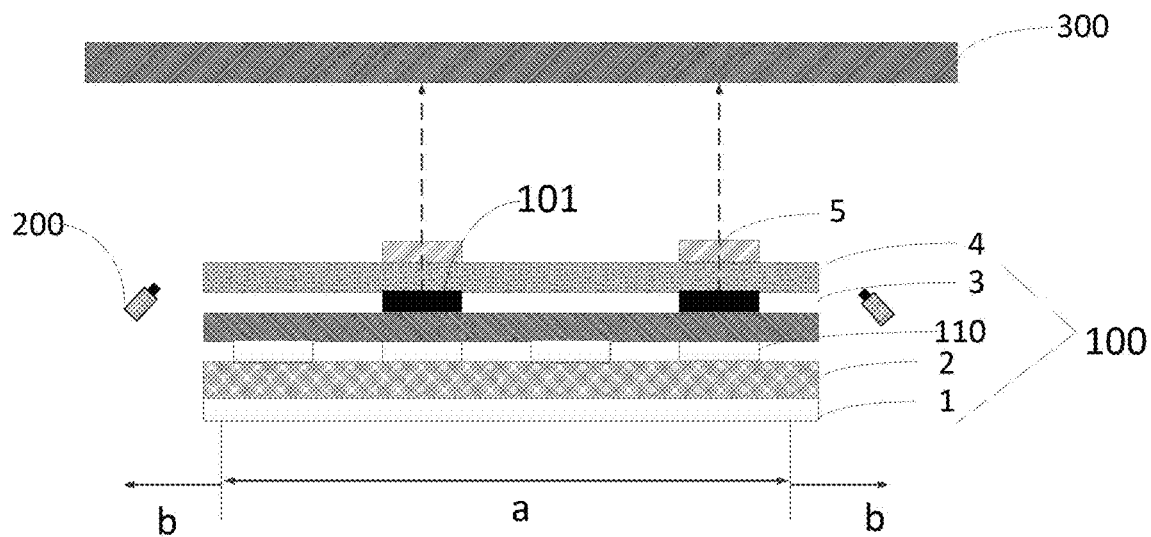
FIG. 7 is a schematic structural view of acquiring depth information of an object by using a display device according to another embodiment of the present disclosure.

According to an embodiment of the present disclosure, the shape, material, and arrangement position of the lens are not particularly limited as long as the infrared light emitted from the light conversion material can be concentrated into a light beam. In some embodiments, the lens may be a planoconvex lens. The light is incident from a plane side of the planoconvex lens, and emitted from a convex surface side. Thus, the light is concentrated by the refraction of the planoconvex lens, the energy is more concentrated, and the detection precision and accuracy are higher. In some embodiments, the material of the lens may be a transparent resin including, for example, but not limited to, an optical glue or the like, so that the lens is highly compatible with existing display panels, and has a wide range of material source and low cost. In some embodiments, the lens may be disposed on the surface of the light conversion material at the light emitting side, or may be disposed on the surface of the substrate/package thin film 4 at the light emitting side (see FIG. 7, showing a schematic structural view), which simplifies the structure and is easy to implement, and can effectively achieve the convergence of infrared light.

According to an embodiment of the present disclosure, the structure of the display device may refer to the structure of a conventional display device. Specifically, the display device may include a processing device (for calculating the depth information), a circuit structure and the like, in addition to the display panel and the information receiving device as described above, which will not be described here. The type of the display device is not particularly limited as long as the requirements can be met. Those skilled in the art can flexibly select according to actual requirements, for example, the type of the display device may be a television, a computer, a mobile phone, etc.

In another aspect of the present disclosure, the present disclosure provides a method for fabricating the display device as described above. According to an embodiment of the present disclosure, the method includes: forming a display panel having a plurality of sub-pixels, and providing a light conversion material on a surface at a light emitting side of a light emitting layer of each of part of the sub-pixels, to form an information collection sub-pixel; providing an information receiving device on at least one side of the display panel. It has been found that the method is simple, convenient, and easy to implement. The information receiving device and the infrared projection light source are integrated in the same display device. Also, the method is low in production cost, high in product yield, and easy to mass-produce. It should be noted that the above-mentioned display panel and the information receiving device are consistent with the foregoing description, and details will not be repeated herein.

According to an embodiment of the present disclosure, providing the light conversion material on the surface at the light emitting side of the light emitting layer of each of part of the sub-pixels includes: forming the light conversion material on the surface at the light emitting side of the light emitting layer of each of part of the sub-pixels by an evaporation method. In some embodiments, an anode, a light emitting layer, and a cathode may be formed to be stacked at one time and then, evaporated on the surface of the cathode away from the light emitting layer to form a light conversion material. Thus, the operation is simple, convenient, and easy to implement, and the thickness of the light conversion material film layer and the area ratio of the orthographic projection of the light conversion material on the light emitting layer to the light emitting layer can be effectively controlled so that a display device capable of simultaneously realizing the spatial positioning function and the display function can be acquired on the basis of the existing OLED process.

According to an embodiment of the present disclosure, the method further includes a step of providing a lens on a light emitting side of the light conversion material. Thus, the operation is simple, convenient, and easy to implement; the light emitted by the information collection sub-pixel may be emitted to the external object in the form of a light beam, so that the spatial positioning is more accurate; and the acquired depth information of the external object is more accurate.

According to an embodiment of the present disclosure, the step of providing the lens on the light emitting side of the light conversion material includes: coating a whole layer of optical resin on a surface at the light emitting side of the light conversion material, or a surface at the light emitting side of the substrate/package thin film 4. Then, the optical resin is processed by a development-exposure-etching method to retain the optical resin only at a position corresponding to the light conversion material and remove the optical resin at the remaining portion, and form a morphology having a concentrated light effect, so as to form a lens (such as a planoconvex lens) having the concentrated light effect.

Figure 4:
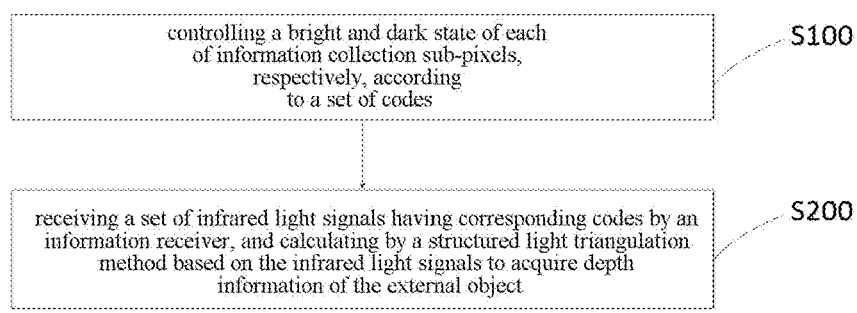
FIG. 4 shows a method for collecting information by using a display device according to an embodiment of the present disclosure.

In another aspect of the present disclosure, the present disclosure provides a method for collecting information using the display device as described above. According to an embodiment of the present disclosure, referring to FIG. 4, the method includes steps:

S100: controlling a bright and dark state of each of information collection sub-pixels, respectively, according to a set of codes.

According to an embodiment of the present disclosure, a plurality of codes in the set of codes are in one-to-one correspondence with the bright and dark states of the information collection sub-pixels, and there is a difference between any two of the codes. Thus, all of the information collection sub-pixels may be distinguished by using the above codes, and the positional relationship between the information receiving device and the information collection sub-pixel may be determined using the one-to-one corresponding feature between the codes and the information collection sub-pixels, thus, facilitating the acquisition of depth information of external objects in the later period.

According to an embodiment of the present disclosure, in order to effectively distinguish information collection sub-pixels, each of the codes includes at least two bits, each bit of the codes corresponds to a bright and dark state of the information collection sub-pixel at a moment, the same bits in the plurality of codes correspond to the bright and dark states of the plurality of information collection sub-pixels at the same moment, and the bright and dark state of the sub-pixel at a corresponding moment is controlled according to different values of each bit in the code. Thus, the information collection sub-pixel is coded by the change of the bright and dark state, effectively realizing the distinction between the information collection sub-pixels. Also, since the bright and dark state of the infrared light emitted by the information collection sub-pixel is consistent with the bright and dark state of the information collection sub-pixel, the infrared light emitted by the light conversion material in the information collection sub-pixel has the same code as the corresponding information collection sub-pixel does, and thus, the bright and dark state of the infrared light signal reflected by the external object is consistent with the bright and dark state of the infrared light emitted by the information collection sub-pixel, i.e., the infrared light signal reflected by the external object also has the same code as the corresponding information collection sub-pixel. Thus, the infrared light signals may effectively one-to-one correspond to the information collection sub-pixels that form the infrared light signals, thereby effectively identifying the depth information of the external object.

In some embodiments of the present disclosure, each of the codes includes n bits, where n is an integer greater than or equal to 2, and a first bit, a second bit, . . . , a nth bit in each of the codes correspond to the corresponding bright and dark states of the information collection sub-pixel at continuous first, second, . . . , nth moments, respectively. Thus, each bit of each code corresponds to a bright and dark state at a moment, and when the bright and dark state continuously changes, the bright and dark state of the infrared light emitted by the light conversion material is continuously changed accordingly, so that the depth information of the external object can be continuously acquired, and then, a real-time positioning can be realized.

In some specific embodiments of the present disclosure, the set of codes is a set of Gray codes, the corresponding bit in the corresponding code is valued as one of 0 and 1 when the information collection sub-pixel is in a bright state, and the corresponding bit in the corresponding code is valued as the other one of 0 and 1 when the information collection sub-pixel is in a dark state. Thus, the coding method is simple and convenient, and the method for distinguishing information collection sub-pixels is simple, and also the method for controlling the brightness and darkness thereof is relatively simple, which is advantageous for reducing cost. In additional embodiments of the present disclosure, when the information collection sub-pixel is in a bright state, the corresponding bit in the corresponding code has a value of 1, and when the information collection sub-pixel is in a dark state, the corresponding bit in the corresponding code has a value of 0. Thus, the method for distinguishing information collection sub-pixels is simpler, and the method for controlling the brightness and darkness thereof is also simpler.

According to an embodiment of the present disclosure, a method for controlling a bright and dark state of an information collection sub-pixel is described by taking a 4-bit Gray code as an example (hereinafter, a light conversion material provided in a blue sub-pixel is taken as an example), as follows:

The 4-bit Gray code has sixteen codes (i.e., 0000, 0001, 0011, 0010, 0110, 0111, 0101, 0100, 1100, 1101, 1111, 1110, 1010, 1011, 1001, 1000), which can be used to code sixteen blue sub-pixels, i.e., the light conversion material may be provided in the sixteen blue sub-pixels. When the blue sub-pixel is in the dark state and does not emit light, the light conversion material is not excited to emit infrared light, and the code is set as 0 at this time. When the blue sub-pixel is lit, the light conversion material is excited to emit infrared light, and the code is set as 1 at this time. According to this rule, the blue sub-pixel at the 0000 coding point does not emit light and cannot be recognized. After this point is excluded, points can be coded, i.e., fifteen blue sub-pixels may be coded.

Figure 5:
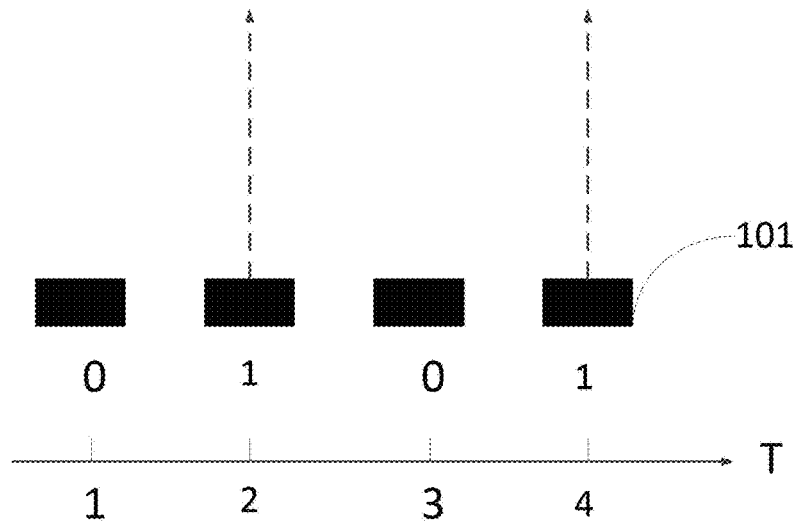
FIG. 5 is display states of an information collection sub-pixel at different moments according to an embodiment of the present disclosure.

At four consecutive moments marked as 1, 2, 3 and 4, the No. 1 blue sub-pixel (marked as P1) having the light conversion material is controlled to be displayed as dark, dark, dark, and bright; the No. 2 blue sub-pixel (marked as P2) is displayed as dark, dark, bright, and bright; the No. 3 blue sub-pixel (marked as P3) is displayed as dark, dark, bright, and dark; and the No. 4 . . . , that is, the fifteen blue sub-pixels having light conversion materials may be acquired to correspond to the 4-bit codes P1 to P15: 0001, 0011, 0010, 0110, 0111, 0101, 0100, 1100, 1101, 1111, 1110, 1010, 1011, 1001, 1000, and FIG. 5 shows the display state of the blue sub-pixel corresponding to the code 0101 at the four moments. According to an embodiment of the present disclosure, when the spatial positioning is performed, the information collection sub-pixels are continuously displayed in accordance with the codes. For example, for the sub-pixels coded as 0001, they are displayed in the continuous time as the code 000100010001 . . . . In order to avoid confusion of pixel codes, a time internal T between a moment just after the pixel is displayed in accordance with the code 0001 and a moment corresponding to the first bit in the next code 0001 may be longer, while a time interval between moments corresponding to any two adjacent bits in the code 0001 is equal to and less than the above-mentioned time interval T. In some embodiments of the present disclosure, taking the 60 Hz display as an example, the time interval between the moments corresponding to any two adjacent bits in the code 0001 may be 16 ms (in this time interval, the external object may be regards as stationary). The time interval T may be 32 ms, and thus, in a picture at 60 frames per second, 5 blank frames may be removed to realize the spatial information scanning at most 13 times per second (52 frames). Thus, the above codes can be distinguished without confusion and can improve the accuracy of spatial positioning. It should be noted that the above description is performed by using the code 0001 as an example, and the distinction and display state of other codes may refer to the code 0001.

It should be noted that, when the information collection sub-pixel performs the spatial positioning, it controls the bright and dark state according to the above code and, when the display panel is normally displayed, the information collection sub-pixel also needs to be displayed according to a certain gray scale and color according to the display screen requirements. When the bright and dark state of the spatial positioning conflicts with the gray scale and color of the normal display, it is preferable to display according to codes of the spatial positioning. Thus, since the number of information collection sub-pixels and the number of all the sub-pixels are relatively small, the normal display function is hardly affected when the spatial positioning is performed.

S200: receiving a set of infrared light signals having corresponding codes by an information receiver, and calculating by a structured light triangulation method based on the infrared light signals to acquire depth information of the external object.

According to an embodiment of the present disclosure, since it takes a certain time for the infrared light emitted from the information collection sub-pixel to be reflected by the external object and then, received by the information receiving device, the information receiver receiving a set of infrared light signals having corresponding codes includes: after the information collection sub-pixels are correspondingly displayed at each moment, and the information collection device (such as an infrared camera) is utilized within a certain period of time (i.e., the time since the infrared light is emitted from the information collection sub-pixel and reflected by the external object until the infrared light is received by the information receiving device) to collect an infrared light signal reflected from a surface of an external object, where the information receiving device receives a light spot corresponding to the infrared light signal, and it should be noted that the information receiving device cannot receive any infrared light signal when the information collection sub-pixel does not emit light; while the information receiving device can continuously receive the infrared light signal during the spatial positioning. Since the information collection sub-pixel is displayed according to a certain code, the light conversion material may also emit infrared light according to the corresponding code, and then the light spot received by the information receiving device may also have the corresponding code; and when the information collection sub-pixels are sequentially displayed according to bits of the codes, the information receiving device may receive the infrared light signals having the above codes, and the infrared light signals may be in one-to-one correspondence with the information collection sub-pixels by comparing the codes of the light spots corresponding to the infrared light signals.

In some embodiments of the present disclosure, the information collection sub-pixel coded as 0101 is taken as an example to illustrate the process of one-to-one corresponding the infrared light signals to the information collection sub-pixels. The process is performed as follows: at the first moment, the information collection sub-pixel does not emit light, the information receiving device cannot receive the light spot corresponding to the infrared light signal within a certain period of time, and the code of the light spot is marked as 0; at the second moment, the information collection sub-pixel emits light, the light conversion material in the information collection sub-pixel is excited to emit infrared light, which is then reflected on the external object, and the information receiving device receives the light spot corresponding to the infrared light signal within a certain period of time, the code of the light spot is marked as 1; at the third moment, the information collection sub-pixel does not emit light (referring to the situation at the first moment), the information receiving device cannot receive the light spot corresponding to the infrared light signal within a certain period of time, and the code of the light spot is marked as 0; and at the fourth moment, the information collection sub-pixel emits light (referring to the situation at the second moment), the information receiving device receives the light spot corresponding to the infrared light signal within a certain period of time, and the code of the light spot is marked as 1. It can be seen that the code of the infrared spot received by the information receiving device is the same as the code of the information collection sub-pixel, as described above, the interval between moments corresponding to two adjacent bits in the above code is very short, and the external object may be regarded as stationary, so that the time for the infrared light propagating from the same information collecting pixel to the information receiving device is constant (specifically, it can be determined according to the distance between the external object and information collection sub-pixel). In addition, the distance between the information collection sub-pixel and the information receiving device is known, and based on this, the depth information of the external object can be calculated by using the structured light triangulation method as described above. It should be noted that the above explanation is based on the premise that the interval between two adjacent moments is small enough to be indistinguishable to the naked eye or the external object is stationary.

According to an embodiment of the present disclosure, as described above, the structured light triangulation method includes: receiving the infrared light signal reflected by an external object within a predetermined time via the information receiving device, and using the distance between the information receiving device and the information collection sub-pixel distance corresponding to infrared light signal to calculate depth information of the external object. Thus, the depth information of the external object can be acquired relatively easily.

According to the embodiment of the present disclosure, the process of acquiring the depth information is continued to be described by taking the above-mentioned fifteen information collection sub-pixels as an example. This process is described below: when an external object enters the recognition range, the infrared light emitted by the light conversion material is irradiated onto the external object, where fifteen information collection sub-pixels correspond to fifteen points of the external object, the infrared light irradiated onto the fifteen points is reflected, and the information receiving device receives the infrared light signals Y1~Y15 reflected at the fifteen points of the external object, and then, the distance between each of the fifteen points and its corresponding sub-pixel is calculated by using the structured light triangulation method to analyze the positional relationships between Y1~Y15 and their corresponding blue sub-pixels P1~P15, i.e., outlining the surface contour of the object. It should be noted that, in actual use, not all infrared light emitted in the information collection sub-pixel can be irradiated to the external object.

According to an embodiment of the present disclosure, the depth information of the external object may also be acquired using the following method: before acquiring the depth information of the external object, the depth information of the reference plane can be acquired according to the step of acquiring the depth information of the external object as defined above; and the depth information of the external object relative to the reference plane can be determined according to the depth information of the external object and the depth information of the reference plane. Thus, the depth information of the external object relative to the reference plane can be acquired relatively accurately.

According to an embodiment of the present disclosure, the process of acquiring the depth information is continued to be described by taking the above-mentioned fifteen information collection sub-pixels as an example. The process is described below: (1) selecting a flat surface, such as a flat panel, a plat wall surface and so forth, using a display device to irradiate the flat surface, and receiving spatial information X1~X15 at fifteen points on the flat surface via the information receiving device to act as reference information; and (2) depth information recognition: when an object enters the recognition range, spatial information Y1~Y15 reflected by the object at fifteen points is received via the information receiving device, wherein X1 and Y1, X15 and Y15 have the same code, respectively, i.e., corresponding to the infrared light emitted from the same information collection sub-pixel. By analyzing the positional relationships between X1 and Y1, X15 and Y15 by means of structured light triangulation method, the depth information of the object based on the reference plane can be calculated. In some embodiments of the present disclosure, the flatness of the wall surface or the like can be acquired by the above method.

According to the embodiment of the present disclosure, the accuracy of the depth information recognition can be improved by increasing the number of information collection sub-pixels, i.e., increasing the number of infrared light sources, and the number of bits of the code may be correspondingly increased so as to perform coding on all the points. Specifically, it can be designed according to the actual requirements of the product.

According to an embodiment of the present disclosure, the above method for collecting information is simple, has high precision and high spatial positioning accuracy, and can acquire comprehensive object depth information. Also, the information collection using the above method can realize the display function at the same time, and has more usage scenarios, which is beneficial to satisfy the customer experience.

In the description of the present disclosure, it should be understood that the orientation or positional relationship indicated by "upper", "lower", and the like is based on the orientation or positional relationship shown in the drawings, and is merely for convenience of description of the present disclosure and for simplifying the description thereof rather than indicating or implying that the device or component must have a specific orientation, or must be configured, or operated in a specific orientation. Thus, it is not intended to be a limitation of the present disclosure.

Moreover, the terms "first" and "second" are used for descriptive purposes only and are not to be construed as indicating or implying a relative importance or implicitly indicating the number of technical features indicated. Thus, features defined by "first" and "second" may explicitly or implicitly include one or more of the features. In the description of the present disclosure, "plurality" means two or more, unless specifically defined otherwise.

In the present disclosure, the first feature being "on" or "under" the second feature may refer to a direct contact of first and second features, or an indirect contact of the first feature and the second feature via an intermediate medium, unless otherwise explicitly stated and defined. Moreover, the first feature being "on", "above", or "over" the second feature may refer to the fact that the first feature is right above or obliquely above the second feature, or merely refer to the fact that the first feature is horizontally higher than the second feature. The first feature being "below" or "under" the second feature may refer to that the first feature is right below or obliquely below the second feature, or merely refer to that the first feature is horizontally lower than the second feature.

In the description of the present specification, the description with reference to the terms "one embodiment", "some embodiments", "example", "specific example", "some examples" or the like means that a specific feature, a structure, a material or a characteristic described in connection with the embodiment or example is included in at least one embodiment or example of the present disclosure. In the present specification, the schematic representation of the above terms is not necessarily directed to the same embodiment or example. Furthermore, the particular features, structures, materials, or characteristics described may be combined in a suitable manner in any one or more embodiments or examples. In addition, various embodiments or examples described in the specification, as well as features of various embodiments or examples, may be cooperated and combined when they are not mutual contradiction.

Although the embodiments of the present disclosure have been shown and described above, it should be understood that the foregoing embodiments are illustrative and are not to be construed as limitation of the present disclosure. Changes, modifications, substitutions, and variations of the above-described embodiments are possible for those skilled in the art within the scope of the present disclosure.

What is claimed is:

1. A display device comprising:
    a display panel having a plurality of sub-pixels, at least a portion of the sub-pixels being information collection sub-pixels each provided with a light conversion material, the light conversion material being configured to absorb light emitted by the information collection sub-pixels and emit infrared light to an external object; and
    an information receiving device disposed on at least one side of a display area of the display panel in a non-display area of the display panel, the information receiving device being configured to receive an infrared light signal reflected by the external object, and to acquire depth information of the external object according to the infrared light signal,
    wherein a line between and connecting the information receiving device and a respective one of the information collection sub-pixels, a line between and connecting a light spot generated when the infrared light emitted by the respective one of the information collection sub-pixels is irradiated on the external object and the respective one of the information collection sub-pixels, and a line connecting the light spot and the information receiving device substantially form a right triangle.

2. The display device according to claim 1, wherein the information collection sub-pixels are distributed on the display panel according to a predetermined pattern, the predetermined pattern comprising at least one of: a dot matrix, a circle, a circular ring, a regular polygon, and an irregular polygon.

3. The display device according to claim 1, wherein at least one of the information collection sub-pixels is a blue sub-pixel, and the light conversion material is a material that absorbs blue light and emits infrared light.

4. The display device according to claim 3, wherein the light conversion material is selected from $Y_{1.98-x}Yb_xEu_{0.02}O_3$ series phosphor, where x ranges from 0 to 0.1.

5. The display device according to claim 1, wherein the light conversion material is disposed on at least a portion of a surface at a light emitting side of a light emitting element of the information collection sub-pixels.

6. The display device according to claim 5, wherein a lens is provided on a light emitting side of the light conversion material of each of the information collection sub-pixels for concentrating the infrared light emitted by the light conversion material.

7. The display device according to claim 6, wherein the lens is disposed on a surface at the light emitting side of the light conversion material, or disposed on a surface at a light emitting side of a substrate/package thin film of the display panel.

8. A method for fabricating a display device, comprising:
    forming a display panel having a plurality of sub-pixels, and providing a light conversion material on a surface at a light emitting side of a light emitting layer of each of part of the sub-pixels so as to form an information collection sub-pixel; and
    providing an information receiving device on at least one side of the display panel in a non-display area of the display panel,
    wherein a line between and connecting the information receiving device and the information collection sub-pixel, a line between and connecting a light spot generated when the infrared light emitted by the information collection sub-pixel is irradiated and the information collection sub-pixel, and a line connecting the light spot and the information receiving device substantially form a right triangle.

9. The method according to claim 8, further comprising providing a lens on a light emitting side of the light conversion material.

10. A method for collecting information using a display device, comprising:
    providing the display device, the display device comprising:
        a display panel having a plurality of sub-pixels, at least a portion of the sub-pixels being information collection sub-pixels each provided with a light conversion material, the light conversion material being configured to absorb light emitted by the information collection sub-pixels and emit infrared light to an external object; and
        an information receiving device disposed on at least one side of a display area of the display panel, the information receiving device being configured to receive an infrared light signal reflected by the external object, and to acquire depth information of the external object according to the infrared light signal;
    controlling a bright and dark state of each of the information collection sub-pixels according to a set of codes, a plurality of codes in the set of codes being in one-to-one correspondence with the bright and dark states of the information collection sub-pixels, and there being a difference between any two of the codes;
    receiving a set of infrared light signals having corresponding codes by an information receiver; and
    determining depth information of the external objection using a structured light triangulation method based on the infrared light signals.

11. The method according to claim 10, wherein each of the codes in the set of codes comprises at least two bits, each bit corresponding to a bright and dark state of the information collection sub-pixels at a moment, the same bit in the plurality of codes corresponding to the bright and dark states of the information collection sub-pixels at the same moment, wherein the bright and dark state of the sub-pixel at a corresponding moment is controlled according to different values of each bit in the codes.

12. The method according to claim 11, wherein each of the codes in the set of codes comprises n bits, where n is an integer greater than or equal to 2, and a first bit, a second bit, . . . , a nth bit in each of the codes correspond to the corresponding bright and dark states of the information collection sub-pixel at continuous first, second, . . . , nth moments, respectively.

13. The method according to claim 11, wherein the set of codes is a set of Gray codes, a corresponding bit in the corresponding code is valued as one of 0 and 1 when the information collection sub-pixel is in a bright state, and the corresponding bit in the corresponding code is valued as the other one of 0 and 1 when the information collection sub-pixel is in a dark state.

14. The method according to claim 12, wherein the set of codes is a set of Gray codes, a corresponding bit in the corresponding code is valued as one of 0 and 1 when the information collection sub-pixel is in a bright state, and the corresponding bit in the corresponding code is valued as the other one of 0 and 1 when a respective one of the information collection sub-pixels is in a dark state.

15. The method according to claim 10, further comprising:
- acquiring depth information of a reference plane before acquiring the depth information of the external object; and
- determining the depth information of the external object with respect to the reference plane according to the depth information of the external object and the depth information of the reference plane.

* * * * *